United States Patent [19]

Chao et al.

[11] Patent Number: 5,747,196
[45] Date of Patent: May 5, 1998

[54] METHOD OF FABRICATING A PHASE-SHIFT PHOTOMASK

[75] Inventors: Fang-Ching Chao, Hsinchu; Tien-Chiieh Li, Hsinchu Hsien, both of Taiwan

[73] Assignee: United Microelectronics Corporation, Taiwan

[21] Appl. No.: 695,300

[22] Filed: Aug. 9, 1996

[51] Int. Cl.⁶ .......................................... G03F 9/00
[52] U.S. Cl. .............................. 430/5; 430/322
[58] Field of Search ..................... 430/5, 322, 323, 430/324

[56] References Cited

U.S. PATENT DOCUMENTS

| | | | |
|---|---|---|---|
| 5,290,647 | 3/1994 | Miyazaki et al. | 430/5 |
| 5,397,663 | 3/1995 | Uesawa et al. | 430/5 |
| 5,397,664 | 3/1995 | Noelscher et al. | 430/5 |
| 5,591,549 | 1/1997 | Yang | 430/5 |

*Primary Examiner*—S. Rosasco
*Attorney, Agent, or Firm*—Rabin, Champagne & Lynt, P.C.

[57] ABSTRACT

A method of forming a phase-shift photomask that reduces the defect density, manufacture cost, and fabrication processing time. A transparent layer is prepared. Then a light-transmissive thin film and a light-blocking thin film are successively formed over the transparent layer. Using a photoresist mask, a first anisotropic etch is performed on the wafer to remove exposed parts of the light-transmissive thin film and the light-blocking thin film. An isotropic etch is then performed on the photoresist layer so as to uncover a specific width of an edge part of the light-blocking thin film. Using the etched photoresist layer as a mask, a second anisotropic etch is performed on the light-blocking thin film. The photoresist layer is then removed to form the desired phase-shift photomask.

4 Claims, 5 Drawing Sheets

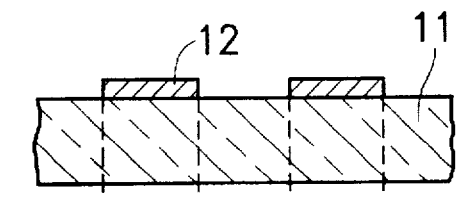
FIG. 2A (PRIOR ART)
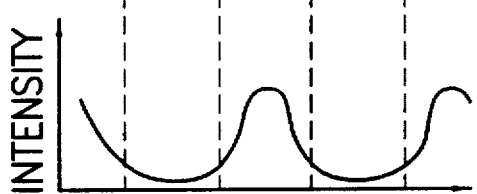
FIG. 2B (PRIOR ART)
FIG. 2C (PRIOR ART)
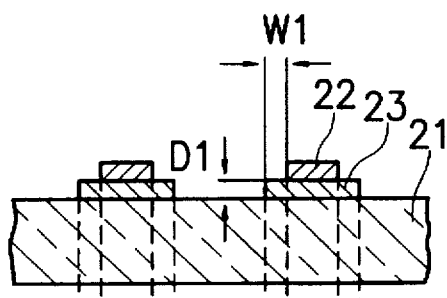
FIG. 4A (PRIOR ART)
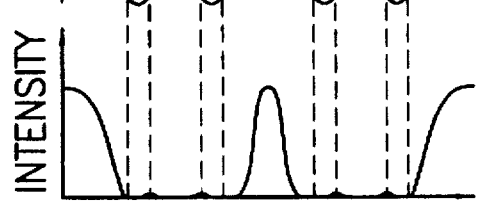
FIG. 4B (PRIOR ART)
FIG. 4C (PRIOR ART)

METHOD OF FABRICATING A PHASE-SHIFT PHOTOMASK

BACKGROUND OF THE INVENTION

1. Field of the Invention

The invention relates to semiconductor fabrication processes, and more particularly, to a method for fabricating a phase-shift photomask which is to be used in a photolithographic process for pattern transfer of a particular circuit layout to a semiconductor wafer. Characteristically, the phase-shift photomask provides destructive interference in regions that are intended to be unexposed to the exposure light and yet receive part of the exposure light due to diffraction.

2. Description of the Related Art

In a lithographic process, a photomask (also called "mask", "exposure mask", or "projection mask") is used for providing pattern definition of a circuit layout on a wafer. The photomask is formed with a predefined pattern of transparent portions which allow an exposure light (usually ultraviolet light in photolithography or an electron beam in microlithography) to pass therethrough to a light sensitive emulsion on the wafer, so that the emulsion can then be developed to form the desired layout pattern.

It is desired that the photomask allow the exposure light to project an edge-sharp image of the pattern onto the wafer, which has been resist-coated. However, due to diffraction at the edges of the transparent portions on the photomask, part of the exposure light strays sideways to the regions that are intended not to be exposed to the exposure light, thus causing transfer of a degraded definition of the pattern to the wafer.

A conventional method for fabricating a typical photomask which would cause the aforementioned problem is described in the following with reference to FIGS. 1A-1D and FIGS. 2A-2C.

Referring first to FIG. 1A, in a first step a transparent layer 11 made of glass or the like is prepared. A thin film 13 of light-blocking material, such as chromium (Cr) or MoSi, is then coated over the transparent layer 11, and an electron-beam resist layer 14 coated over the light-blocking thin film 13. A beam of electrons 15 under digital computer control is then used to bombard selected portions of the electron-beam resist layer 14.

Referring next to FIG. 1B, in a subsequent step the bombarded portions of the electron-beam resist layer 14 are removed through development. The development step is a conventional technique, so that description thereof will not be further detailed.

Referring next to FIG. 1C, in a subsequent step the electron-beam resist layer 14 is used as a mask to etch away the exposed part of the light-blocking thin film 13 to leave an etched light-blocking thin film 12 having openings therein. The openings through the remaining light-blocking thin film 12 are exactly matched in shape to the openings through the overlaying electron-beam resist layer 14.

Referring further to FIG. 1D, in a final step the electron-beam resist layer 14 is entirely removed. The remaining light-blocking thin film 12 and the transparent layer 11 in combination serve as the desired photomask.

When the photomask of FIG. 1D is used in a photolithographic process, it would cause the exposure light passing through the openings to be subject to diffraction effects, as depicted in FIGS. 2A-2C. FIG. 2A shows the photomask of FIG. 1D, FIG. 2B shows the amplitude of the exposure light that has passed through the photomask, and FIG. 2C shows the intensity of the same.

It can be seen from FIGS. 2B and 2C that part of the exposure light is diffracted into the regions that are laid directly beneath the light-blocking thin film 12 and intended not to be exposed to the exposure light. This would cause unsharp edges on the image projected on the wafer, thus degrading the definition of the transferred pattern on the wafer.

Employing what is referred to as a "phase-shift photomask" (or simply as a "phase mask"), the aforementioned diffraction effect can be reduced to a minimum by intentionally building a destructive interference between two openings, so as to cause the diffracted light to be canceled out or at least minimized in the regions that are intended to be unexposed to the exposure light. To achieve this, the phase-shift photomask is devised in such a manner that the light passing through neighboring openings is shifted in phase by exactly 180°.

Various methods have been proposed to form a phase-shift photomask, including, for instance, methods proposed in U.S. Pat. No. 5,290,647 to Miyazaki et al., U.S. Pat. No. 5,397,663 to Uesawa et al., and U.S. Pat. No. 5,397,664 to Noelscher et al.

Among the aforementioned patents, the U.S. Pat. No. 5,290,647 to Miyazaki et al. discloses, particularly, a phase-shift photomask which is quite simple in structure.

However, the method for fabricating such a phase-shift photomask is quite complicated and involves laborious process steps to achieve. This drawback is described in the following, with reference to FIGS. 3A–3H and FIGS. 4A–4C (which are the same drawings shown in FIGS. 6A–6H and FIGS. 5A–5C of U.S. Patent No. 5,290,647).

Referring first to FIG. 3A, in the first step a transparent layer 21 is prepared. Subsequently, a light-transmissive thin film 24, a light-blocking thin film 25, and an electron-beam resist layer 26 are successively formed on the transparent layer 21. After that, a beam of electrons 27 is used under digital computer control to bombard selected portions of the electron-beam resist layer 26.

Referring next to FIG. 3B, in a subsequent step the bombarded portions of the electron-beam resist layer 26 are removed through development. The development step is a conventional technique so that description thereof will not be further detailed.

Referring next to FIG. 3C, in a subsequent step the electron-beam resist layer 26 is used as a mask, while exposed portions of the light-blocking thin film 25 (not covered by the electron-beam resist layer 26) are etched away, leaving a remaining part 22 of the light-blocking thin film 25.

Referring next to FIG. 3D, in a subsequent step the electron-beam resist layer 26, laying above the remaining light-blocking thin film 22, is removed. Then, referring to FIG. 3E, a polysilicon layer 28 of uniform thickness is formed over the entire wafer.

Referring now to FIG. 3F, in a subsequent step anisotropic etching is performed on the wafer until the top surface of the light-blocking thin film 22 and the light-transmissive thin film 24 is exposed. Through the anisotropic etching, a small portion of the polysilicon layer 28 that abuts the lateral side of the light-blocking thin film 22, is still left on the wafer.

Referring next to FIG. 3G, in a subsequent step the light-blocking thin film 22 and the remaining polysilicon layer 28 are together used as a mask in an etching process on the wafer. This process removes the uncovered portions of the light-transmissive thin film 24 to leave a remaining portion 23.

Referring further to FIG. 3H, in a final step further etching is performed on the wafer so as to remove the polysilicon layer 28. This completes the process for fabricating the desired phase-shift photomask.

As shown in FIG. 4A, in order to assure that diffracted exposure light substantially cancels out, the light-transmissive thin film 23 should be formed with a thickness of D1 as follows:

$$D1 = \lambda/2(n-1)$$

where $\lambda$ is the wavelength of the exposure light, and n is the refractive index of the remaining light-transmissive thin film 23.

Referring further to FIG. 4B, by forming the light-transmissive film 23 according to the foregoing formula, the light that has passed through the exposed part of the light-transmissive film 23 (the part indicated by the width WI) is shifted in phase by 180° with a reduced amplitude, which cancels out the diffracted light to a substantially negligible level. The intensity distribution shown in FIG. 4C makes clear that the regions beneath the light-transmissive film 23 receive a substantially zero illumination.

As shown in FIG. 4A, U.S. Pat. No. 5,290,647 to Miyazaki et al. discloses a phase-shift photomask that is quite simple in structure. However, it has a drawback hat the process steps involved therein, as depicted in FIG. 3A through FIG. 3H, are quite complicated and laborious to carry out. The method is thus too costly to implement economically. There therefore exists a need for a new method that allows the fabrication of the phase-shift photomask of FIG. 4A to be implemented in an easy and simple manner.

SUMMARY OF THE INVENTION

It is therefore an object of the invention to provide a method for fabricating the aforementioned phase-shift photomask in an easy and simple manner.

It is another object of the invention to provide a method for fabricating the aforementioned phase-shift photomask in a cost-effective manner.

In accordance with the foregoing and other objects of the invention, a new and improved method of fabricating a phase-shift photomask is provided. According to the method, a transparent layer is performed. Then, a light-transmissive thin film and a light-blocking thin film are successively formed over the transparent layer. After that, a photoresist layer having a predefined pattern of openings is formed over the lightblocking thin film. Using the photoresist layer as a mask, a first anisotropic etch is performed on the wafer to remove a selected part of the light-transmissive thin film and the light-blocking thin film. An isotropic etch is then performed on the photoresist layer so as to uncover edge portions of the light-blocking thin film. Then, using the etched photoresist layer as a mask, a second anisotropic etch process is performed on the light-blocking thin film. Finally, the photoresist layer is removed and a phase-shift photomask is formed. In the preferred embodiment, the light-blocking thin film is made of chromium (Cr), and the isotropic etch is performed by an erosion process.

The use of an erosion process in the foregoing method to etch the surface part of the photoresist layer allows the fabricating of the phase-shift photomask to be significantly simplified relative to the prior art method. It also provides the benefits of reducing the defect density, the manufacture cost, and the processing time associated with the fabrication of the phase-shift photomask.

BRIEF DESCRIPTION OF DRAWINGS

The invention will be more fully understood from the subsequent detailed description of the preferred embodiment with reference to the accompanying drawings, wherein:

FIG. 2A is a sectional view of the photomask formed by the steps shown in FIG. 1A through FIG. 1D;

FIGS. 2B and 2C are graphs showing the distribution respectively of the amplitude and intensity distribution of an exposure light that has passed through the photomask of FIG. 2A;

FIG. 4A is a schematic sectional view of the phase-shift photomask formed by the steps illustrated in FIG. 3A through FIG. 3H;

FIGS. 4B and 4C are graphs showing the distribution respectively of the amplitude and intensity of exposure light that has passed through the phase-shift photomask of FIG. 4A.

DETAILED DESCRIPTION OF PREFERRED EMBODIMENT

FIGS. 5A-5E are schematic sectional views depicting the steps involved in the method according to the invention for fabricating a phase-shift photomask.

Figure 1A:
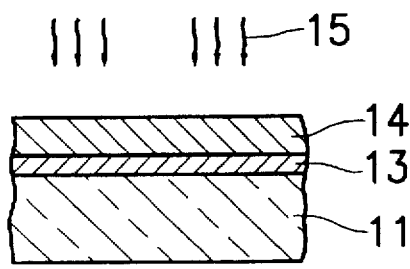
FIG. 1A through FIG. 1D are schematic sectional views depicting the steps involved in a conventional method of fabricating a typical photomask (with no phaseshift capability)
Figure 1B:
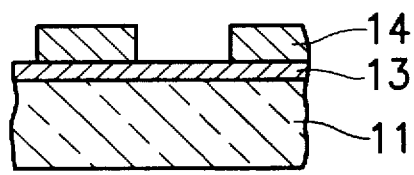
Figure 1C:
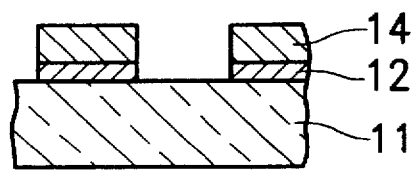
Figure 1D:
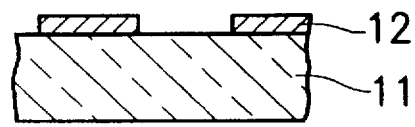
Figure 3A:
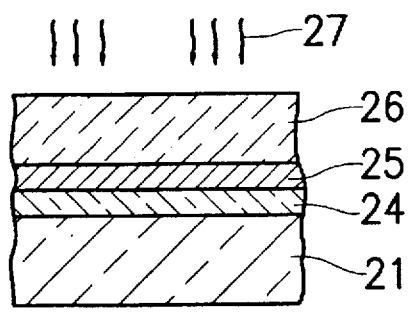
FIGS. 3A-3H are schematic sectional views depicting the steps involved in a prior art method for fabricating a phase-shift photomask.
Figure 3B:
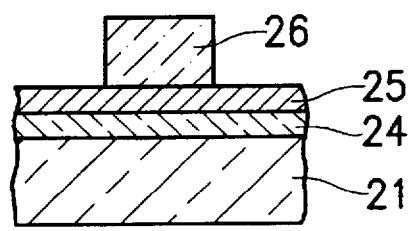
Figure 3C:
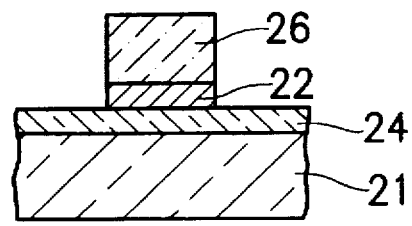
Figure 3D:
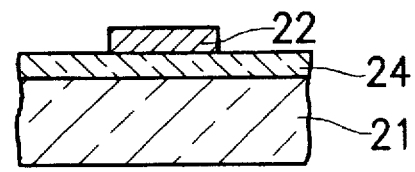
Figure 3E:
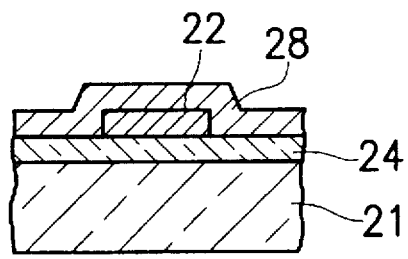
Figure 3F:
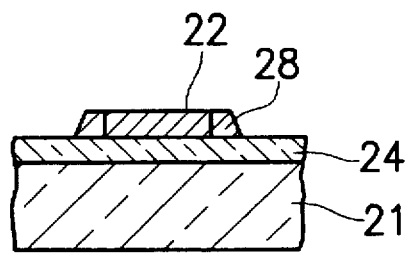
Figure 3G:
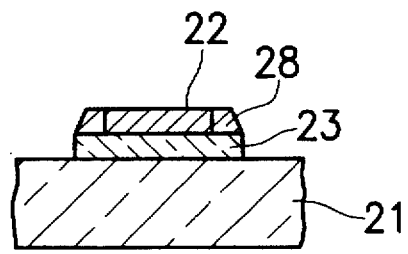
Figure 3H:
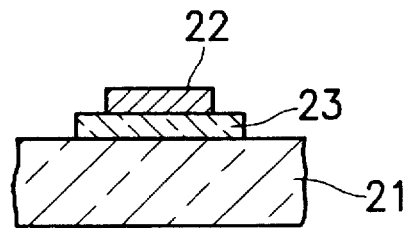
Figure 5A:
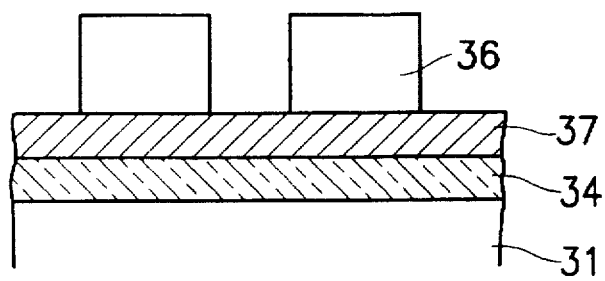
FIGS. 5A-5E are schematic sectional views depicting the steps involved in the method according to the invention for fabricating the phase-shift photomask shown in FIG. 4A.

Referring first to FIG. 5A, a transparent layer 31 is prepared. Then, a light-transmissive thin film 34 and a light-blocking thin film 37 are successively formed on the transparent layer 31. In the preferred embodiment, the light-blocking thin film 37 is made of an opaque material such as chromium (Cr). A photoresist layer 36 having a predefined pattern of openings is then formed over the light-blocking thin film 37.

Figure 5B:
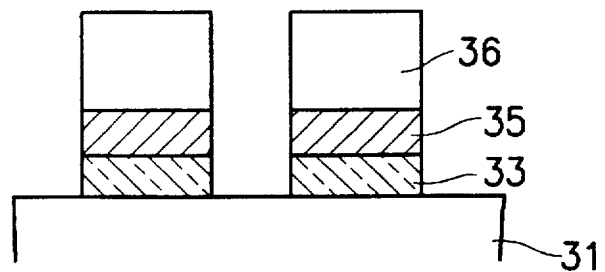

Referring next to FIG. 5B, in a subsequent step the photoresist layer 36 is used as a mask to anisotropically etch away the exposed portions of the light-blocking thin film 37 and the light-transmissive thin film 34, through the openings leaving a remaining part 35 of the light-blocking thin film 37 and a remaining part 33 of the light-transmissive thin film 34.

Figure 5C:
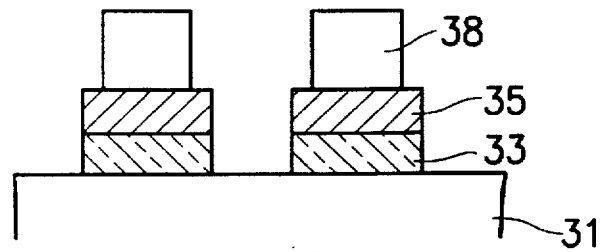

Referring next to FIG. 5C, by a subsequent erosion process, a specific depth of the photoresist layer 36 is isotropically etched away at upper and side surfaces thereof, leaving a remaining photoresist layer 38. As a result, an edge part of the light-blocking thin film 35, of a specific width, is uncovered and exposed.

Figure 5D:
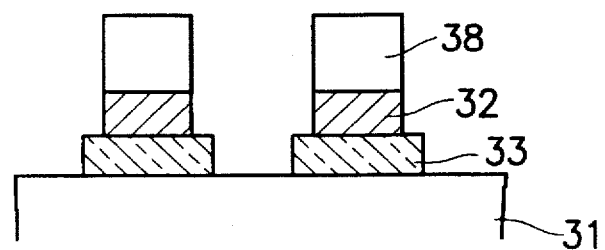

Referring next to FIG. 5D, in a subsequent step the photoresist layer 38 as a mask, an anisotropic etch on the wafer, so as to remove the exposed edge part of the light-blocking thin film 35, i.e., the portion not laid directly beneath the photoresist layer 38, thereby leaving a remaining part 32 of the light-blocking thin film 35. This allows the remaining light-blocking thin film 32 to be matched in shape with the overlaying photoresist layer 38. As a result, an the edge part of the light-transmissive thin film 33, of a specific width, is uncovered and exposed.

Figure 5E:
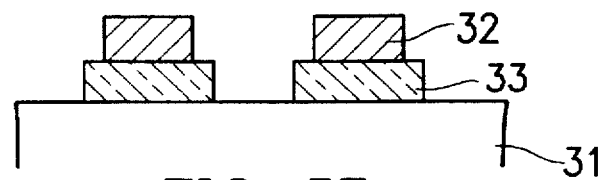

Referring further to FIG. 5E, in a final step the photoresist layer 38 is removed so as to expose the underlying remaining light-blocking thin film 32. A phase-shift photomask identical in structure to that shown in FIG. 4A, is thus fabricated.

The use of an erosion process in the foregoing method allows the fabricating of the phase-shift photomask to be significantly simplified relative to that of the prior art method depicted in FIG. 3A through FIG. 3H. This also provides the benefits of reducing the defect density, the manufacture cost, and the processing time associated with the fabrication of the phase-shift photomask. The method according to the invention therefore provides a cost-effective method of manufacturing the phase-shift photomask.

The invention has been described above with an exemplary preferred embodiment. However, it is to be understood that the scope of the invention is not limited to the disclosed preferred embodiment. To the contrary, it is intended to cover various modifications and similar arrangements. The scope of the claims should therefore be accorded the broadest interpretation so as to encompass all such modifications and similar arrangements.

What is claimed is:

1. A method of fabricating a phase-shift photomask, comprising the steps of:

(1) preparing a transparent layer;

(2) forming a light-transmissive thin film over the transparent layer, the light-transmissive thin film having a specific refractive index;

(3) forming a light-blocking thin film over the light-transmissive thin film;

(4) forming a photoresist layer having a predefined pattern of openings, over the light-blocking thin film;

(5) using the photoresist layer as a mask, performing a first anisotropic etch on the light-transmissive thin film and the light-blocking thin film;

(6) performing an isotropic etch on the photoresist layer so as to uncover an edge part of specific width of the light-blocking thin film;

(7) using the etched photoresist layer as a mask, performing a second anisotropic etch on the light-blocking thin film; and (8) removing the photoresist layer.

2. A method as claimed in claim 1, wherein the light-blocking thin film is made of chromium.

3. A method as claimed in claim 1, wherein in said step (6), the isotropic etch is performed by an erosion process.

4. A method of fabricating a phase-shift photomask, comprising:

forming a body, comprising a transparent layer, a light-transmissive thin film over the transparent layer, and a light-blocking thin film over the light-transmissive thin film;

forming a photoresist layer having a predefined pattern of openings, over the light-blocking thin film;

using the photoresist layer as a mask, performing a first anisotropic etch to remove successively exposed portions of the light-transmissive thin film and the light-blocking thin film, through the openings;

after the first anisotropic etch, performing an isotropic etch on the photoresist layer adjacent to the openings so as to expose an edge part of the light-blocking thin film of a specific width;

using the etched photoresist layer as a mask, performing a second anisotropic etch to remove the exposed edge part of the light-blocking thin film; and removing the photoresist layer.

* * * * *